(12) United States Patent
Zhang et al.

(10) Patent No.: US 8,416,216 B2
(45) Date of Patent: Apr. 9, 2013

(54) METHOD AND SYSTEM FOR TOUCH SENSOR INTERFACE FAULT DETECTION

(75) Inventors: Jun Zhang, Suzhou (CN); Yan Huang, Suzhou (CN); Wei Luo, Suzhou (CN); Wangsheng Mei, Suzhou (CN); Yang Wang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 228 days.

(21) Appl. No.: 13/092,166

(22) Filed: Apr. 22, 2011

(65) Prior Publication Data
US 2012/0007829 A1 Jan. 12, 2012

(30) Foreign Application Priority Data
Jul. 8, 2010 (CN) .................... 2010 1 0222612

(51) Int. Cl.
*G06F 3/045* (2006.01)

(52) U.S. Cl. .... 345/174; 324/520; 324/537; 324/750.01
(58) Field of Classification Search .......... 345/173–178; 361/42; 714/25, 30; 324/500–537; 702/58
See application file for complete search history.

(56) References Cited

U.S. PATENT DOCUMENTS

| 5,341,133 A | 8/1994 | Savoy |
| 7,561,144 B2 | 7/2009 | Ziegler |
| 2009/0160820 A1 | 6/2009 | Lii |
| 2009/0250268 A1 | 10/2009 | Staton |

*Primary Examiner* — Bipin Shalwala
*Assistant Examiner* — Lisa Landis
(74) *Attorney, Agent, or Firm* — Charles Berqere

(57) ABSTRACT

A touch sensor interface includes one or more touch detection electrodes whose capacitance increases when touched. A processor converts the increase in capacitance into a change in a counter value. A detector compares the change in the counter value with one or more count thresholds to detect faults in the touch sensor interface.

15 Claims, 4 Drawing Sheets

METHOD AND SYSTEM FOR TOUCH SENSOR INTERFACE FAULT DETECTION

BACKGROUND OF THE INVENTION

The present invention relates generally to touch sensor interfaces and more particularly, to fault detection in touch sensor interfaces.

Capacitive touch sensing enables touch detection by measuring a change in the capacitance of one or more touch detection electrodes. Since the human body is conductive, touch capacitive sensing technology can be used for human operated interfaces.

Referring now to FIG. 1, a schematic diagram illustrating a conventional touch sensor interface 100 is shown. The touch sensor interface 100 includes shared input/output (I/O) pads 102a and 102b, a touch sensing processor 104, sets of touch detection electrodes 106a and 106b, capacitors 108a, 108b, 108c, and 108d, communication channels 110a and 110b, and touch detection electrodes 112a and 112b.

Each set of touch detection electrodes 106a and 106b includes one or more of the touch detection electrodes 112a and 112b. The capacitance of the touch detection electrodes 112a and 112b prior to a touch event comprises an external capacitance, viz. parasitic capacitance, $C_{ext}$, corresponding to the capacitors 108a and 108c. After being touched, the capacitance of the touch electrodes comprises the parasitic capacitance $C_{ext}$ and a touch capacitance, $C_{touch}$, between the PCB traces and external object (i.e., finger), corresponding to capacitors 108b and 108d. Thus, upon the occurrence of a touch event, the capacitance of a touch detection electrode at the touched location increases.

The touch sensing processor 104 scans the touch detection electrodes 112a and 112b for an increase in the touch capacitance. The scanning is accomplished using a touch sensing signal transmitted between the touch detection electrodes 112a and 112b and the touch sensing processor 104. The touch sensing signal travels over the communication channels 110a and 110b and the shared I/O pads 102a and 102b. The shared I/O pads 102a and 102b are associated with various I/O systems of the device to which the touch sensor interface 100 belongs, such as an illumination or visual source, an auditory source, a switch, a sensor, a haptics mechanism and the like. The shared I/O pads 102a and 102b are configured to operate in various modes corresponding to the different I/O mechanisms. For example, in a touch sensing mode, the shared I/O pads 102a and 102b are configured using software to monitor the touch detection electrodes 112a and 112b for a touch event. In an input mode, the shared I/O pads 102a and 102b are configured to monitor an input mechanism for the receipt of an input, and in an output mode, the shared I/O pads 102a and 102b are configured to provide an output to an output mechanism. In the touch sensing mode, the shared I/O pads 102a and 102b transmit the touch sensing signal to the touch detection electrodes 112a and 112b to measure an increase in the touch capacitance thereof. The touch sensing processor 104 processes the touch sensing signal to determine the occurrence of the touch event and generates a corresponding signal for the further operation of the device.

Since the touch sensor interfaces do not have moving parts, they are robust in design and thus do not require maintenance and have long operational lives. The technological suitability for human operation, the robustness of the design, and operational ease render touch sensor interfaces a preferred choice for human machine interfaces of various consumer electronic devices such as laptop computers, televisions, refrigerators, mobile phones, personal digital assistants and so forth. The touch sensor interfaces are also used in automobiles for gauges, door entry operation, windshield wiper switches, and other dashboard applications. Further, touch sensors may be used in automobiles for human safety critical applications such as seat belt alarm systems and air-bag deployment systems. Additionally, the touch sensor interfaces are used in critical medical equipment such as life support systems.

Although the touch sensor interface has a robust architecture, still they are prone to hardware and software faults such as a PCB trace open, a PCB trace short, a touch detection electrode leakage, a software configuration fault, and a communication channel short fault. Since, the touch sensor interfaces are used in applications related to human safety and life support systems, it is essential to detect the various hardware and software faults to ensure safe operation of the devices.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
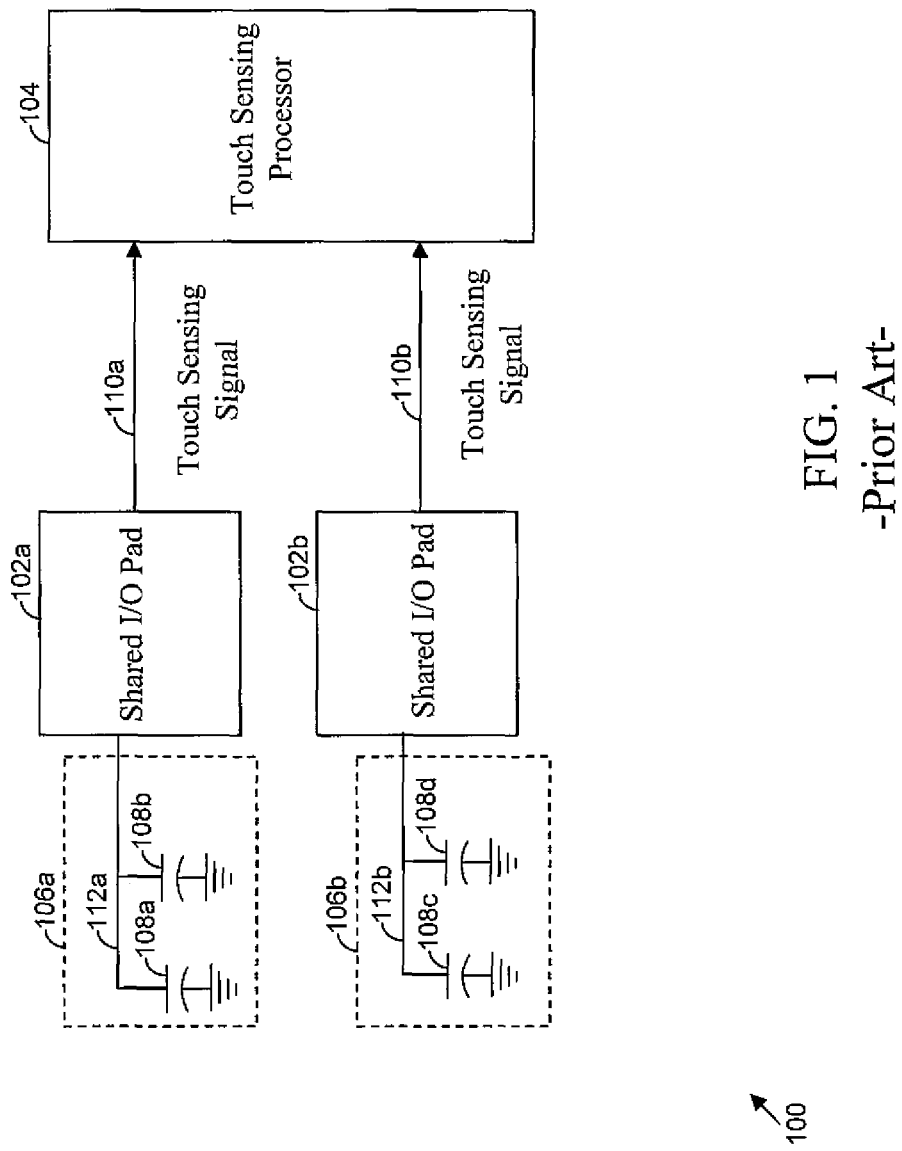
FIG. 1 is a schematic diagram illustrating a conventional touch sensor interface.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for detecting one or more faults in a touch sensor interface is provided. The touch sensor interface comprises one or more touch detection electrodes for sensing a touch event. The system includes a first oscillator, connected to at least one touch detection electrode, for generating a first periodic signal based on the capacitance of at least one touch detection electrode. The system further includes a prescaler which is connected to the first oscillator. The prescaler reduces the frequency of the first periodic signal by a predetermined value to generate a second periodic signal. The second periodic signal is provided to a counter, connected to the prescaler, for receiving the second periodic signal and a third periodic signal in which the frequency of the third periodic signal is greater than the frequency of the second periodic signal. Further, the counter is updated for a count time window equal to a time period of the second periodic signal and the counter is updated for a plurality of counts based on the frequency of the third periodic signal.

The system also includes a fault and touch detector that is connected to the counter. The fault and touch detector detects the one or more faults by calculating a difference between the plurality of counts corresponding to the count time window with a previous plurality of counts corresponding to a previous count time window and comparing the difference between the plurality of counts and the previous plurality of counts with one or more count thresholds.

In another embodiment of the present invention, a touch sensor interface is provided. The touch sensor interface includes at least one touch detection electrode for sensing a touch event. Further, the touch sensor interface includes shared input/output (I/O) pad which is connected to the at least one touch detection electrode. The shared I/O pad receives and transmits one or more touch sensing signals from the at least one touch detection electrode. Additionally, the shared I/O pad receives an input signal provided to the touch sensor interface and transmits an output signal to the touch sensor interface. The shared I/O pad is connected to a communication channel. The communication channel receives the touch sensing signal from the shared I/O pad. The touch sensor interface further includes a first oscillator, connected to at least one touch detection electrode, for generating a first periodic signal based on the capacitance of at least one touch detection electrode and a prescaler which is connected to the first oscillator. The prescaler reduces the frequency of the first periodic signal by a predetermined value to generate a second periodic signal. The second periodic signal is provided to a counter, connected to the prescaler, for receiving the second periodic signal and a third periodic signal in which the frequency of the third periodic signal is greater than the frequency of the second periodic signal. Further, the counter is updated for a count time window equal to a time period of the second periodic signal and the counter is updated for a plurality of counts based on the frequency of the third periodic signal.

The system also includes a fault and touch detector connected to the counter. The fault and touch detector detects the one or more faults by calculating a difference between the plurality of counts corresponding to the count time window with a previous plurality of counts corresponding to a previous count time window and comparing the difference between the plurality of counts and the previous plurality of counts with one or more count thresholds. Additionally, the touch sensor interface includes a programmable current source which is connected to the first oscillator and to the second oscillator for providing a first current to the first oscillator and providing a second current to the second oscillator.

In an embodiment of the present invention, a method for detecting faults in a touch sensor interface is provided in which the touch sensor interface includes at least one touch detection electrode. The method includes generating a first periodic signal based on the capacitance of the touch detection electrode. Thereafter, the frequency of the first periodic signal is reduced by a predetermined value to generate a second periodic signal. Based on the second periodic signal and a third periodic signal, a counter is updated, in which the frequency of the third periodic signal is higher than the frequency of the second periodic signal. The counter is configured to update for a count time window equal to the time period of the second periodic signal and the counter modifies for a plurality of counts based on the frequency of the third periodic signal. Thereafter, a difference between the plurality of counts corresponding to the count time window and a previous plurality of counts corresponding to a previous count time window is calculated. The difference between the plurality of counts and the previous plurality of counts is compared with one or more count thresholds to detect the one or more faults in the touch sensor interface.

Various embodiments of the present invention provide a system and method for detecting one or more faults in a touch sensor interface, in which the touch sensor interface includes at least one touch detection electrode. A counter is incremented proportionally to the capacitance of the touch detection electrode. The counter is read to obtain a counter reading. A difference is calculated between the counter reading and a previous counter reading. The difference is compared with one or more count thresholds to detect hardware and software faults in the touch sensor interface. The system and method detect hardware faults such as a PCB trace open fault, a PCB trace short fault, a touch detection electrode leakage fault, and a communication channel short fault. Additionally, a software configuration fault is also detected. The detection of such faults ensures that a user using the touch sensor interface is informed about the faults prior to the use of the device. The user can then perform maintenance procedures to eliminate such faults, thereby ensuring safe operation.

Figure 2:
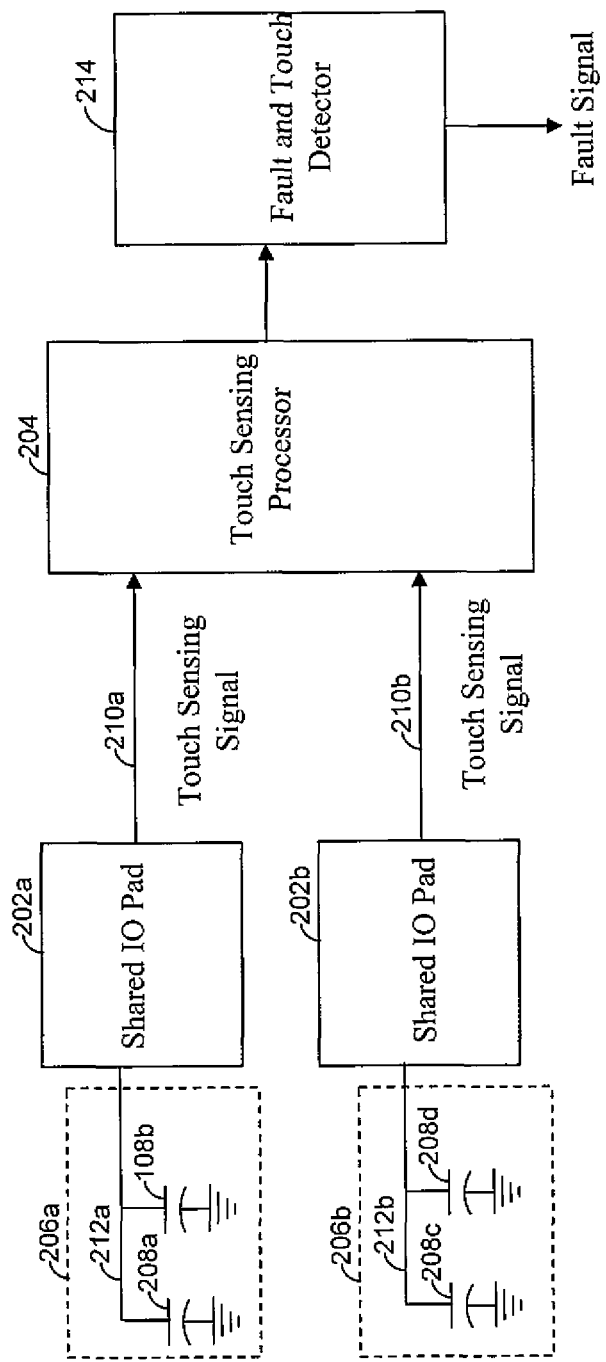
FIG. 2 is a schematic diagram illustrating a touch sensor interface in accordance with an embodiment of the present invention.

Referring now to FIG. 2, a schematic diagram illustrating a touch sensor interface 200 in accordance with an embodiment of the present invention is shown. The touch sensor interface 200 includes shared input/output (I/O) pads 202a and 202b, a touch sensing processor 204, sets of touch detection electrodes 206a and 206b, capacitors 208a, 208b, 208c, and 208d, communication channels 210a and 210b, touch detection electrodes 212a and 212b, and a fault detector 214.

The touch sensor interface 200 includes one or more sets of touch detection electrodes 206a and 206b. Each set of touch detection electrodes 206a and 206b includes one or more touch detection electrodes 212a and 212b. In an embodiment of the present invention, the touch detection electrodes 212a and 212b are formed using a pair of printed circuit board (PCB) traces (not shown). Further, each set of touch detection electrodes 206a and 206b is connected to the shared I/O pads 202a and 202b. The shared I/O pads 202a and 202b transmit a touch sensing signal received from the touch detection electrodes 206a and 206b to the touch sensing processor 204 via the communication channels 210a and 210b.

The capacitance of the touch detection electrodes 212a and 212b prior to a touch event is composed of an external capacitance, viz. parasitic capacitance, $C_{ext}$, corresponding to the capacitors 208a and 208c and subsequent to the touch event is composed of $C_{ext}$ and a touch capacitance, $C_{touch}$, capacitance between the PCB traces and an external object, viz. finger, corresponding to capacitors 208b and 208d. Thus, upon the occurrence of a touch event, i.e., the touch sensor interface 200 is touched using a conductive object, such as a finger, the capacitance of a touch detection electrode present at the location of touching increases.

The touch sensing processor 204 scans the touch detection electrode 212a and 212b for an increase in the touch capacitance. The scanning is accomplished by the use of a touch sensing signal transmitted back and forth between the touch detection electrode 212a and 212b and the touch sensing processor 204. The touch sensing signal travels through the communication channels 210a and 210b and the shared I/O pads 202a and 202b. The shared I/O pads 202a and 202b are associated with various I/O systems of the device to which the touch sensor interface 200 belongs. Examples of I/O systems may be an illumination or visual source, an auditory source, a switch, a sensor, a haptics mechanism and the like. The shared I/O pads 202a and 202b are configured to operate in various modes corresponding to the different I/O systems. For example, in a touch sensing mode, the shared I/O pads 202a and 202b are configured using software to monitor the touch detection electrodes 212a and 212b for a touch event. In input mode, the shared I/O pads 202a and 202b are configured to monitor an input system for the receipt of an input. Further, in the output mode, the shared I/O pads 202a and 202b are configured to provide an output to an output system. During the touch sensing mode, the shared I/O pads 202a and 202b transmit the touch sensing signal to the touch detection electrodes 212a and 212b to measure an increase in the touch capacitance thereof. The touch sensing processor 204 processes the touch sensing signal to determine the increase in the capacitance of the touch detection electrode.

Further, the fault detector 214 scans the touch sensing processor 204 for detecting the touch event, and hardware and software faults in the touch sensor interface 200. The functioning of the fault detector 214 and the touch sensing processor 204 has been explained in detail in conjunction with FIG. 3.

Figure 3:
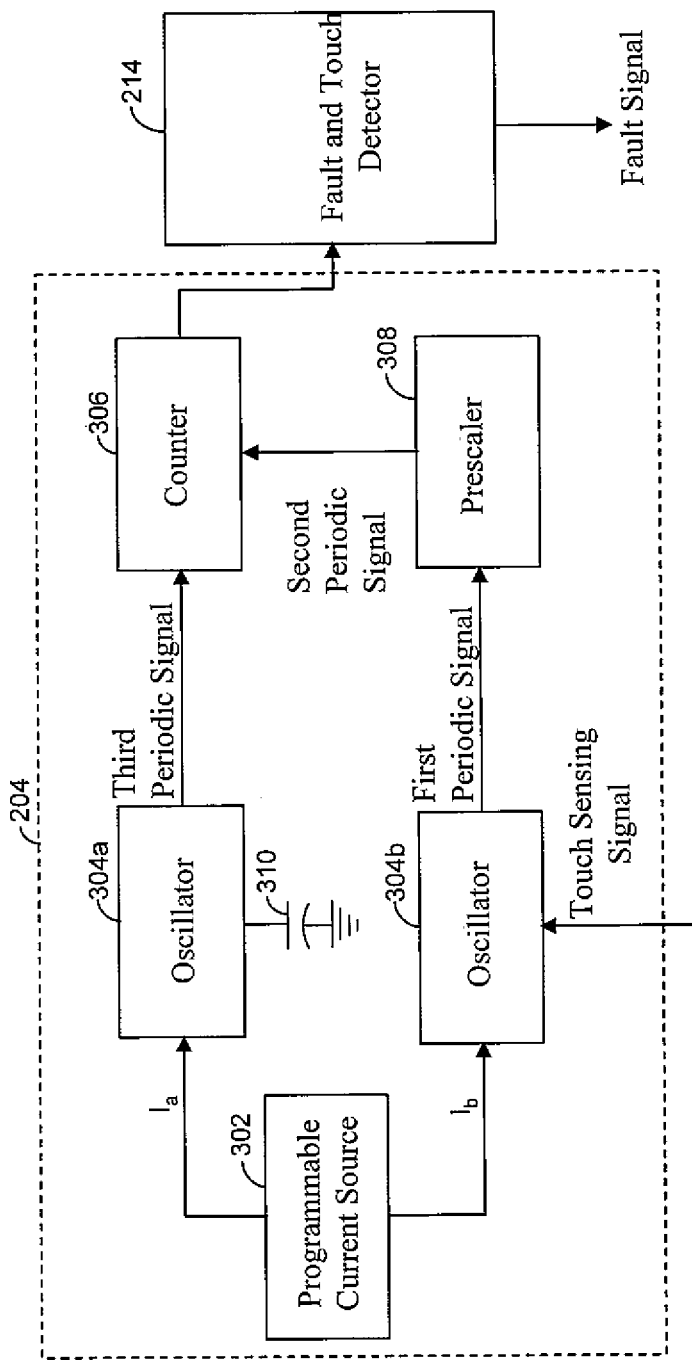
FIG. 3 is a schematic diagram illustrating a system for detecting one or more faults in a touch sensor interface in accordance with an embodiment of the present invention.

Referring now to FIG. 3 is a schematic diagram illustrating a system 300 for detecting one or more faults in accordance with an embodiment of the present invention is shown. The system 300 includes the touch sensing processor 204 and the fault and touch detector 214. The touch sensing processor 204 includes a programmable current source 302, oscillators 304a and 304b, a counter 306, a prescaler 308, and a capacitor 310.

The programmable current source 302 generates currents $I_a$ and $I_b$ which are provided to the oscillators 304a and 304b. The oscillator 304a is configured to generate a third periodic signal with a frequency $f_a$ based on the current $I_a$ and the capacitance of the capacitor 310. In an embodiment of the present invention, the oscillator 304a is a relaxation oscillator. The explanation of the functioning of the relaxation oscillator has been excluded from the present description for the sake of brevity. In an embodiment of the present invention, the capacitance of the capacitor 310 is equal to the reference capacitance ($C_{ref}$). The frequency $f_a$ of the third periodic signal may be expressed mathematically as:

$$f_a = \frac{I_a}{2 \cdot C_{ref} \cdot V_{ref}} \quad (1)$$

Further, the oscillator 304b is configured to generate a first periodic signal with a frequency $f_b$ based on the current $I_b$ and the touch sensing signal obtained from a touch detection electrode. In a scenario when no touch event is detected by the touch detection electrodes 212a and 212b (refer FIG. 2), the frequency $f_b$ of the first periodic signal may be mathematically expressed as:

$$f_b = \frac{I_b}{2 \cdot C_{ext} \cdot V_{ref}} \quad (2)$$

The first periodic signal is provided to the prescaler 308. The prescaler 308 reduces the frequency of the first periodic signal by a predetermined value such as a factor M to generate a second periodic signal. In an embodiment of the present invention, M is programmed using a 7 bit register to have a value between 1 and 128. Thus, the frequency of the second periodic signal is $f_b/M$. The counter 306 receives the second periodic signal and the third periodic signal. The frequency $f_a$ of the third periodic signal is greater than the frequency $f_b/M$ of the second periodic signal. In an embodiment of the present invention, the values of $f_b$ and $f_a$ are 8 kHz and 20 MHz respectively.

The counter 306 is configured to update, i.e. either increment or decrement for a count time window equal to the time period of the second periodic signal. In an embodiment of the present invention, the counter is a 16-bit counter. In an embodiment of the present invention, the counter may be an up counter, a down counter, or an up-down counter. Further, the counter modifies for a plurality of counts equal to the number of wavelengths of the third periodic signal that are received by the counter 306 in the count time window. Thus, the counter reading ($Count_1$) from (1) and (2) after one count time window prior to the occurrence of a touch event is mathematically expressed as:

$$Count_1 = \frac{I_a}{I_b/M} \cdot \frac{C_{ext}}{C_{ref}} \quad (3)$$

Further, in a scenario when a touch event has occurred at a touch detection electrode, the capacitance of the touch detection electrode increases from $C_{ext}$ to $(C_{ext}+C_{touch})$ in which $C_{ext}$ is the external capacitance of the touch detection electrode and $C_{touch}$ is the touch capacitance between the touch detection electrode and an external touching object, viz., finger. Thus, the frequency $f_b$ of the first periodic signal may be mathematically expressed as:

$$f_b = \frac{I_b}{2 \cdot (C_{ext} + C_{touch}) \cdot V_{ref}} \quad (4)$$

Thus, the frequency $f_b$ decreases and the counter reading ($Count_2$) obtained in one count time window subsequent to the occurrence of a touch event may be mathematically expressed as:

$$Count_2 = \frac{I_a}{I_b/M} \cdot \frac{C_{ext} + C_{touch}}{C_{ref}} \quad (5)$$

A touch count threshold may be defined as a difference Δcount between $count_1$ and $count_2$. The touch count threshold implies that a change in the counter reading greater than equal to Δcount signifies the occurrence of a touch event. The difference Δcount may be mathematically expressed as:

$$\Delta Count = M \cdot \frac{I_a}{I_b} \cdot \frac{C_{touch}}{C_{ref}} \quad (6)$$

The counter 306 is read by the fault and touch detector 214 and a difference between the plurality of counts corresponding to the count time window and a previous plurality of counts corresponding to a previous count time window is calculated. When a touch event has not occurred, the counter reading remains almost constant and equal to $count_1$. It should be realized by persons skilled in the art that the counter reading may vary due to noise or physical disturbances. Subsequent to the touch event, the counter reading increases and becomes equal to or greater than $count_2$. Thus, if the difference between the counter reading and the previous counter reading is greater than the touch count threshold, Δcount, the touch event is detected. For example, when $count_1$=2000 and $count_2$=2500, Δcount=2500-2000 and the difference between the counter reading and the previous counter reading is 600.

Since, Δcount<the difference between the counter reading and the previous counter reading (500<600), a touch event is detected by the fault and touch detector 214. The counter is reset subsequent to each count time window.

Further, the fault and touch detector 214 compares the difference between the plurality of counts corresponding to the count time window and a previous plurality of counts corresponding to a previous count time window with one or more count thresholds to detect the one or more faults in the touch sensor interface.

For example, when the touch sensor interface 200 (FIG. 2) has a PCB open trace fault, $C_{ext}$ decreases. This results in an increase in the frequency $f_b$. As a result, Δcount obtained is decreased. The fault and touch detector 214 compares Δcount with an open count threshold. If the Δcount obtained is less than the open count threshold, the fault and touch detector 214 detects the PCB trace open fault.

In another example, when the touch sensor interface 200 has a PCB trace short fault or a touch detection electrode leakage fault, $C_{ext}$ increases. This results in a decrease in the frequency $f_b$ of the first periodic signal. Additionally, the touch sensor interface 200 may have a software configuration fault. As described above, the shared I/O pads 202a and 202b (FIG. 2), are associated with various I/O systems of the touch sensor device and are configured to operate in various modes corresponding to the different I/O systems. The shared I/O pads are configured using software codes to switch between various modes after predefined time intervals for performing tasks related to various I/O systems. If the software configuration is incorrect, the shared I/O pads may not change modes in the desired manner. Thus, the PCB trace short fault, the touch detection electrode leakage fault, and the software configuration fault result in overflow of the counter 306. Thus, Δcount obtained is high as compared to the touch count threshold. The fault and touch detector 214 determines the counter corresponding to a communication channel that is overflowing. In an example, if it is determined that the counter 306 is overflowing, the fault and touch detector 214 compares Δcount with a short count threshold. If the Δcount obtained is greater than the short count threshold, the fault and touch detector 214 signals the PCB trace short fault or the touch detection electrode leakage fault or software configuration fault.

Further, in another example, the touch sensor interface 200 has a communication channel short fault in which two or more communication channels are short. This results in equal Δcount values for the short communication channels. Thus, to detect the communication channel short faults, the fault and touch detector 214 compares each of the Δcount values with each other to identify the communication channels with equal Δcount values. The communication channels identified having equal Δcount values are shorted.

Figure 4:
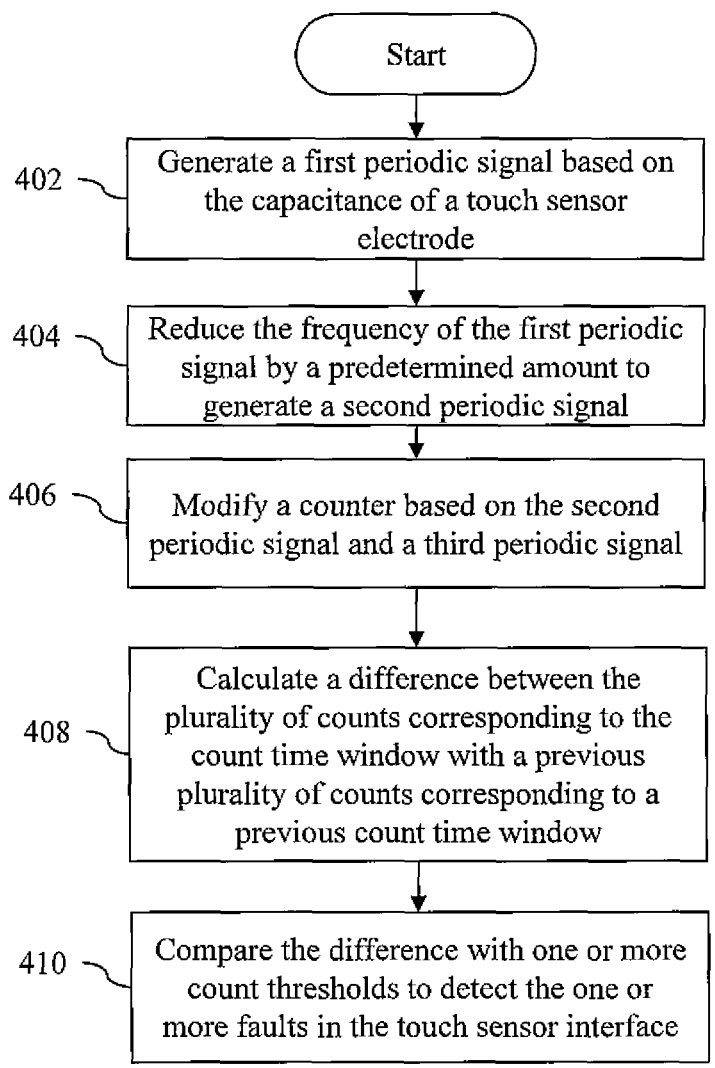
FIG. 4 is a flowchart illustrating a method for detecting faults in a touch sensor interface in accordance with an embodiment of the present invention.

Referring now to FIG. 4, a flowchart illustrating a method for detecting one or more faults in a touch sensor interface in accordance with an embodiment of the present invention is shown.

At step 402, a first periodic signal is generated. In an embodiment of the present invention, a first oscillator generates the first periodic signal having a frequency $f_b$ based on the capacitance of a touch detection electrode and a current $I_b$ provided to the first oscillator. The capacitance of the touch detection electrode prior to a touch event is $C_{ext}$ and subsequent to the touch event is $C_{ext}+C_{touch}$, in which $C_{touch}$ is the touch capacitance between the touch detection electrode and an external touching object, viz., finger. Thus, the frequency $f_b$ of the first periodic signal prior to and subsequent to the touch event may be mathematically expressed as in (2) and (4) respectively. In an embodiment of the present invention, the first oscillator is a relaxation oscillator. Additionally, a third periodic signal is generated using a second oscillator. The third periodic signal has a frequency $f_a$ and is based on a capacitance $C_{ref}$ and a current $I_a$ provided to the second oscillator. Thus, the frequency $f_a$ of the third periodic signal may be mathematically expressed as in (1). In an embodiment of the present invention, the second oscillator is a relaxation oscillator. In an embodiment of the present invention, the currents $I_a$ and $I_b$ are generated using a programmable current source.

At step 404, the frequency of the first periodic signal is reduced by a predetermined value M to generate a second periodic signal. Thus, the frequency of the second periodic signal is $f_b/M$.

At step 406, a counter is updated based on the second periodic signal and the third periodic signal in which updating the counter includes either incrementing or decrementing the counter. The frequency $f_a$ of the third periodic signal is higher than the frequency $f_b/M$ of the second periodic signal. In an embodiment of the present invention, the counter is a 16-bit counter. In an embodiment of the present invention, the counter may be an up counter, a down counter, or an up-down counter. The counter is configured to update for a count time window equal to the time period of the second periodic signal. Further, the counter modifies for a plurality of counts equal to the number of wavelengths of the third periodic signal that are received by the counter in the count time window. Thus, the counter reading (Count$_1$) or the plurality of counts after one count time window prior to a touch event can be mathematically expressed as in (3). Further, the counter reading (Count$_2$) or plurality of counts after one count time window post touch event can be mathematically expressed as in (5).

Further, a touch count threshold may be defined as a difference Δcount between count$_1$ and count$_2$, implying that a change in the counter reading greater than equal to Δcount signifies the occurrence of a touch event. The difference Δcount may be mathematically expressed as in (6).

At step 408, a difference between the plurality of counts corresponding to the count time window and a previous plurality of counts corresponding to a previous count time window is calculated. When a touch event has not occurred, the counter reading remains almost constant and equal to count$_1$. It should be realized by persons skilled in the art that the counter reading may vary due to noise or physical disturbances. Subsequent to the touch event, the counter reading increases and becomes equal to or greater than count$_2$. Thus, if the difference between the counter reading and the previous counter reading is greater than the touch count threshold, Δcount, the touch event is detected.

At step 410, the difference between the plurality of counts corresponding to the count time window and a previous plurality of counts corresponding to a previous count time window is compared with one or more count thresholds to detect the one or more faults in the touch sensor interface.

For example, in a scenario when the touch sensor interface has a PCB open trace fault, the $C_{ext}$ decreases. This results in an increase in the frequency $f_b$. As a result, Δcount obtained is reduced. The Δcount obtained is compared with an open count threshold. If the Δcount obtained is less than open count threshold, the PCB trace open fault is detected.

Further, in another exemplary scenario when the touch sensor interface has a PCB trace short fault or a touch detection electrode leakage fault, the $C_{ext}$ increases. This results in a decrease in the frequency $f_b$ of the first periodic signal. Additionally, the touch sensor interface may have a software configuration fault. As described above in conjunction with FIG. 2, the shared I/O pads are associated with various I/O systems of the touch sensor device and are configured to operate in various modes corresponding to the different I/O systems. The shared I/O pads are configured using software codes to switch between various modes after predefined time intervals for performing tasks related to various I/O systems. If the software configuration is incorrect, the shared I/O pads may not change modes in the desired manner. Thus, the PCB trace short fault, the touch detection electrode leakage fault, and the software configuration fault result in overflow of the counter reading. Thus, Δcount obtained is high as compared to the touch count threshold. The counter corresponding to a communication channel that is overflowing is determined. Subsequent to determining the counter that is overflowing, the Δcount is compared with a short count threshold. If the Δcount obtained is greater than the short count threshold, the PCB trace short fault or the touch detection electrode leakage fault or software configuration fault is detected.

Further, in another exemplary scenario the touch sensor interface has a communication channel short fault in which two or more communication channels are short. This results in equal Δcount values for the short communication channels. Thus, to detect the communication channel short faults, the fault and touch detector compares each of the Δcount values with each other to identify the communication channels with equal Δcount values. The communication channels identified to have equal Δcount values are short.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for detecting one or more faults in a touch sensor interface, the touch sensor interface comprising one or more touch detection electrodes for sensing a touch event, the system comprising:
    a first oscillator, connected to at least one of the touch detection electrodes, for generating a first periodic signal based on the capacitance of the at least one touch detection electrode;
    a prescaler, connected to the first oscillator, for reducing the frequency of the first periodic signal by a predetermined value to generate a second periodic signal;
    a counter, connected to the prescaler, for receiving the second periodic signal and a third periodic signal, wherein the frequency of the third periodic signal is greater than the frequency of the second periodic signal, wherein the counter is updated for a count time window equal to the time period of the second periodic signal, and wherein the counter is updated for a plurality of counts based on the frequency of the third periodic signal; and
    a fault and touch detector, connected to the counter, for detecting the one or more faults by calculating a difference between the plurality of counts corresponding to the count time window and a previous plurality of counts corresponding to a previous count time window and comparing the calculated difference with one or more count thresholds.

2. The fault detection system of claim 1, further comprising at least one shared input/output (I/O) pad, connected to the at least one touch detection electrode, for receiving an input signal provided to the touch sensor interface and for transmitting an output signal to the touch sensor interface.

3. The fault detection system of claim 2, wherein the at least one shared I/O pad receives and transmits one or more touch sensing signals from the at least one touch detection electrode to the first oscillator.

4. The fault detection system of claim 3, further comprising at least one communication channel, connected to the at least one shared I/O pad and the first oscillator, for transmitting the one or more touch sensing signals between the at least one shared I/O pad and the first oscillator.

5. The fault detection system of claim 1, further comprising a second oscillator, connected to the counter, for generating the third periodic signal.

6. The fault detection system of claim 5, further comprising a programmable current source, connected to the first and second oscillators, for providing a first current to the first oscillator and a second current to the second oscillator.

7. The fault detection system of claim 1, wherein the one or more faults comprise at least one of a PCB trace open fault, a PCB trace short fault, a touch detection electrode leakage fault, a software configuration fault, and a communication channel short fault.

8. The fault detection system of claim 7, wherein the one or more count thresholds correspond to at least one of the PCB trace open fault, the PCB trace short fault, the touch detection electrode leakage fault, and the software configuration fault.

9. A touch sensor interface, comprising:
    at least one touch detection electrode for sensing a touch event;
    at least one shared input/output (I/O) pad, connected to the at least one touch detection electrode, for receiving and transmitting one or more touch sensing signals from the at least one touch detection electrode, wherein the at least one shared I/O pad receives an input signal provided to the touch sensor interface and transmits an output signal to the touch sensor interface;
    at least one communication channel, connected to the at least one shared I/O pad, for receiving the one or more touch sensing signals from the at least one shared I/O pad;
    a first oscillator, connected to the at least one communication channel, for generating a first periodic signal based on the capacitance of the at least one touch detection electrode;
    a prescaler, connected to the first oscillator, for reducing the frequency of the first periodic signal by a predetermined value to generate a second periodic signal;
    a counter, connected to the prescaler, for receiving the second periodic signal and a third periodic signal, wherein the third periodic signal is generated by a second oscillator, wherein the frequency of the third periodic signal is greater than the frequency of the second periodic signal, wherein the counter is updated for a count time window equal to the time period of the second periodic signal, and wherein the counter is updated for a plurality of counts based on the frequency of the third periodic signal;
    a programmable current source, connected to the first and second oscillators, for providing a first current to the first oscillator and a second current to the second oscillator; and
    a fault and touch detector, connected to the counter, for detecting the one or more faults by calculating a difference between the plurality of counts corresponding to the count time window and a previous plurality of counts corresponding to a previous count time window and comparing the calculated difference with one or more count thresholds.

10. The touch sensor interface of claim 9, wherein each touch detection electrode comprises one or more printed circuit board (PCB) traces.

11. The touch sensor interface of claim 9, wherein the one or more faults comprise at least one of a PCB trace open fault, a PCB trace short fault, a touch detection electrode leakage fault, a software configuration fault, and a communication channel short fault.

12. The touch sensor interface of claim 11, wherein the one or more count thresholds correspond to at least one of the PCB trace open fault, the PCB trace short fault, the touch detection electrode leakage fault, and the software configuration fault.

13. A method for detecting one or more faults in a touch sensor interface, the touch sensor interface comprising at least one touch detection electrode for sensing a touch event, the method comprising:
- generating a first periodic signal based on the capacitance of the at least one touch detection electrode;
- reducing the frequency of the first periodic signal by a predetermined value to generate a second periodic signal;
- updating a counter based on the second periodic signal and a third periodic signal, wherein the frequency of the third periodic signal is greater than the frequency of the second periodic signal, wherein the counter is updated for a count time window equal to the time period of the second periodic signal, wherein the counter is updated for a plurality of counts based on the frequency of the third periodic signal;
- calculating a difference between the plurality of counts corresponding to the count time window and a previous plurality of counts corresponding to a previous count time window; and
- comparing the calculated difference with one or more count thresholds to detect the one or more faults in the touch sensor interface.

14. The method for detecting one or more faults of claim 13, wherein the one or more faults comprise at least one of a PCB trace open fault, a PCB trace short fault, a touch detection electrode leakage fault, a software configuration fault, and a communication channel short fault.

15. The method for detecting one or more faults of claim 14, wherein the one or more count thresholds correspond to at least one of the PCB trace open fault, the PCB trace short fault, the touch detection electrode leakage fault, and the software configuration fault.

* * * * *